(12) United States Patent
Yan et al.

(10) Patent No.: US 6,351,632 B1
(45) Date of Patent: Feb. 26, 2002

(54) MIXER WITH HIGH ORDER INTERMODULATION SUPPRESSION AND ROBUST CONVERSION GAIN

(75) Inventors: Kai Tuan Yan, Singapore (SG); Junichi Shibata, Tokyo (JP)

(73) Assignees: Institute of Microelectronics; Oki Techno Centre (Singapore) Pte Ltd, both of Singapore (SG)

( * ) Notice: Subject to any disclaimer, the term of this patent is extended or adjusted under 35 U.S.C. 154(b) by 0 days.

(21) Appl. No.: 09/170,727

(22) Filed: Oct. 13, 1998

(51) Int. Cl.[7] ................................. H04B 1/28
(52) U.S. Cl. .................... 455/333; 455/253.2; 455/326; 455/334; 327/355
(58) Field of Search ................. 455/333, 326, 455/323, 334, 341, 141, 144, 217, 230, 245.2, 251.1, 253.2, 271, 311; 327/288, 355, 389, 408

(56) References Cited

U.S. PATENT DOCUMENTS

| | | | |
|---|---|---|---|
| 4,511,813 A | * 4/1985 | Pan | 307/501 |
| 4,845,389 A | 7/1989 | Pyndiah et al. | 307/529 |
| 4,949,398 A | 8/1990 | Maas | 455/326 |
| 5,060,298 A | 10/1991 | Waugh et al. | 455/326 |
| 5,220,688 A | * 6/1993 | Tao | 455/323 |
| 5,306,969 A | 4/1994 | Kimura | 307/529 |
| 5,444,399 A | 8/1995 | Shiga | 327/105 |
| 5,448,197 A | * 9/1995 | Sagawa et al. | 455/333 |
| 5,602,501 A | * 2/1997 | Shiga | 327/105 |
| 5,640,692 A | 6/1997 | Bothorel | 455/127 |
| 6,057,714 A | * 5/2000 | Andrys et al. | 455/333 |
| 6,144,236 A | * 11/2000 | Vice et al. | 455/326 |

OTHER PUBLICATIONS

Stephen A. Maas, "Microwave Mixers", 2nd Edition, Artech House, p. 323–331.

* cited by examiner

Primary Examiner—Lee Nguyen
Assistant Examiner—Simon Nguyen
(74) Attorney, Agent, or Firm—George O. Saile; Stephen B. Ackerman (57) ABSTRACT

A circuit is disclosed for a receiver front-end for a Personal Handy Phone. The circuit consists of a high frequency mixer consisting of a cascade downmixer, tapped at the center, and followed by a common source intermediate (IF) amplifier. The combination of downmixer and IF amplifier provides a high third order intermodulation suppression and a robust conversion gain. The proposed circuit can also be applied to other FET technologies and other uses.

18 Claims, 6 Drawing Sheets

MIXER WITH HIGH ORDER INTERMODULATION SUPPRESSION AND ROBUST CONVERSION GAIN

BACKGROUND OF THE INVENTION

1. Field of the Invention

The invention relates to an integrated circuit for high frequency mixers and more particularly to dual gate cascode mixers in the Giga Hertz range.

2. Description of the Related Art

Noise figure is very often the most critical specification in most receiver networks. Another equally and increasingly important specification is the suppression of the intermodulation or IM products. IM3 or the third order intermodulation is the strongest of the odd harmonic spurious signals that are generated as shown in FIG. 1.

Figure 1:
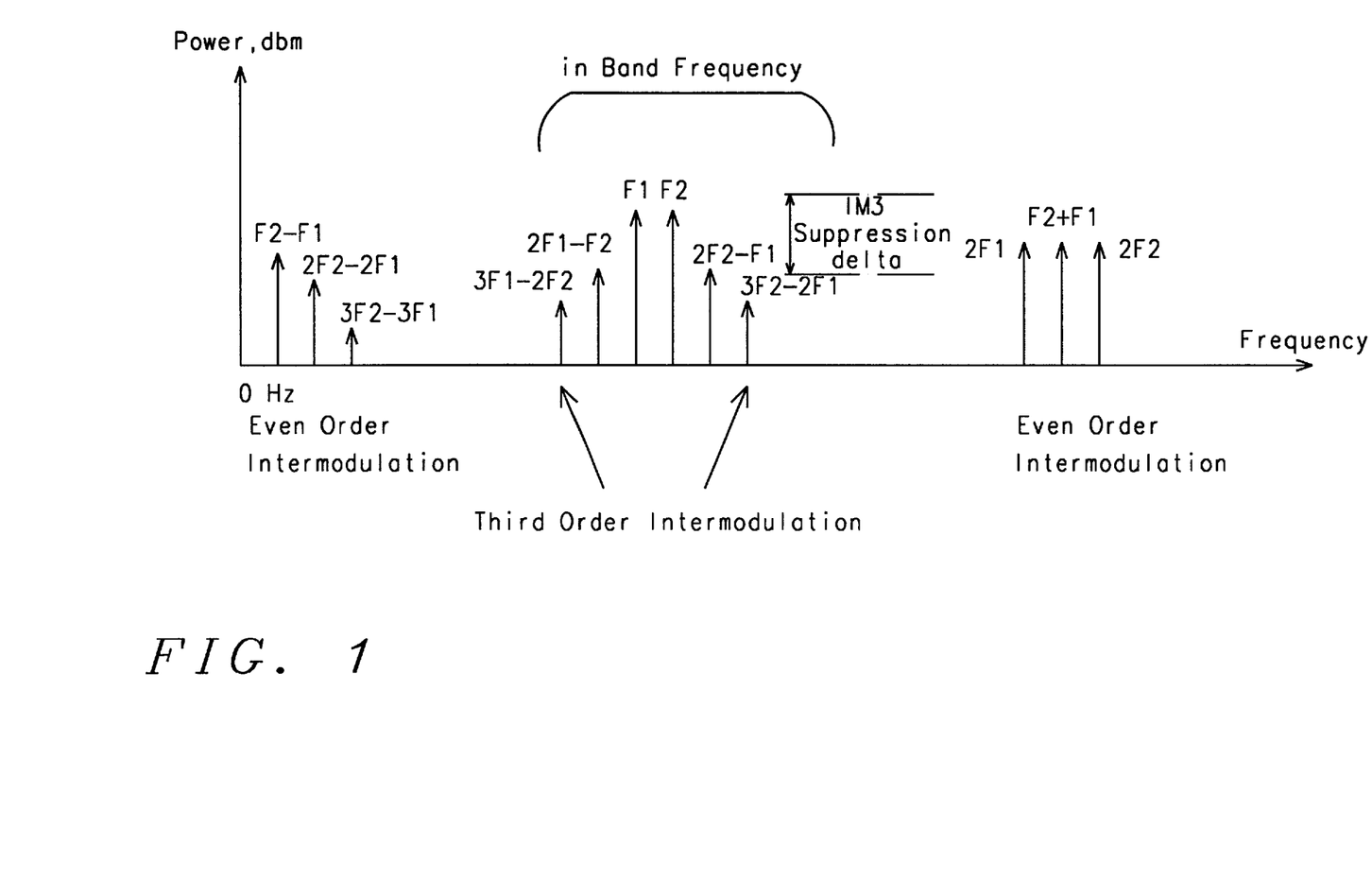
FIG. 1 is a graph of the frequency distribution of two signals and their intermodulation products.

In FIG. 1, F1 and F2 denote signal at two frequencies. When the two signals are mixed, intermodulation (IM) frequencies are generated. FIG. 1 displays these IM frequencies as a function of power, in dBM. These IM frequency are the sums or differences of frequencies F1 and F2 or of their multiples. Third order intermodulation products are shown grouped around F1 and F2, while even order intermodulation products are shown spread in groups of three at some distance (frequency) at either side of F1 and F2.

Suppression of IM products is an area of important consideration in the receiver design of most transceiver networks because spurious signals can be misinterpreted as the desired signals. In an ideal situation one would want to suppress all IM signals, be they odd or even orders. One can effectively suppress the even order IM located at the low and high frequency end, by using matching networks as shown in FIG. 2.

Figure 2:
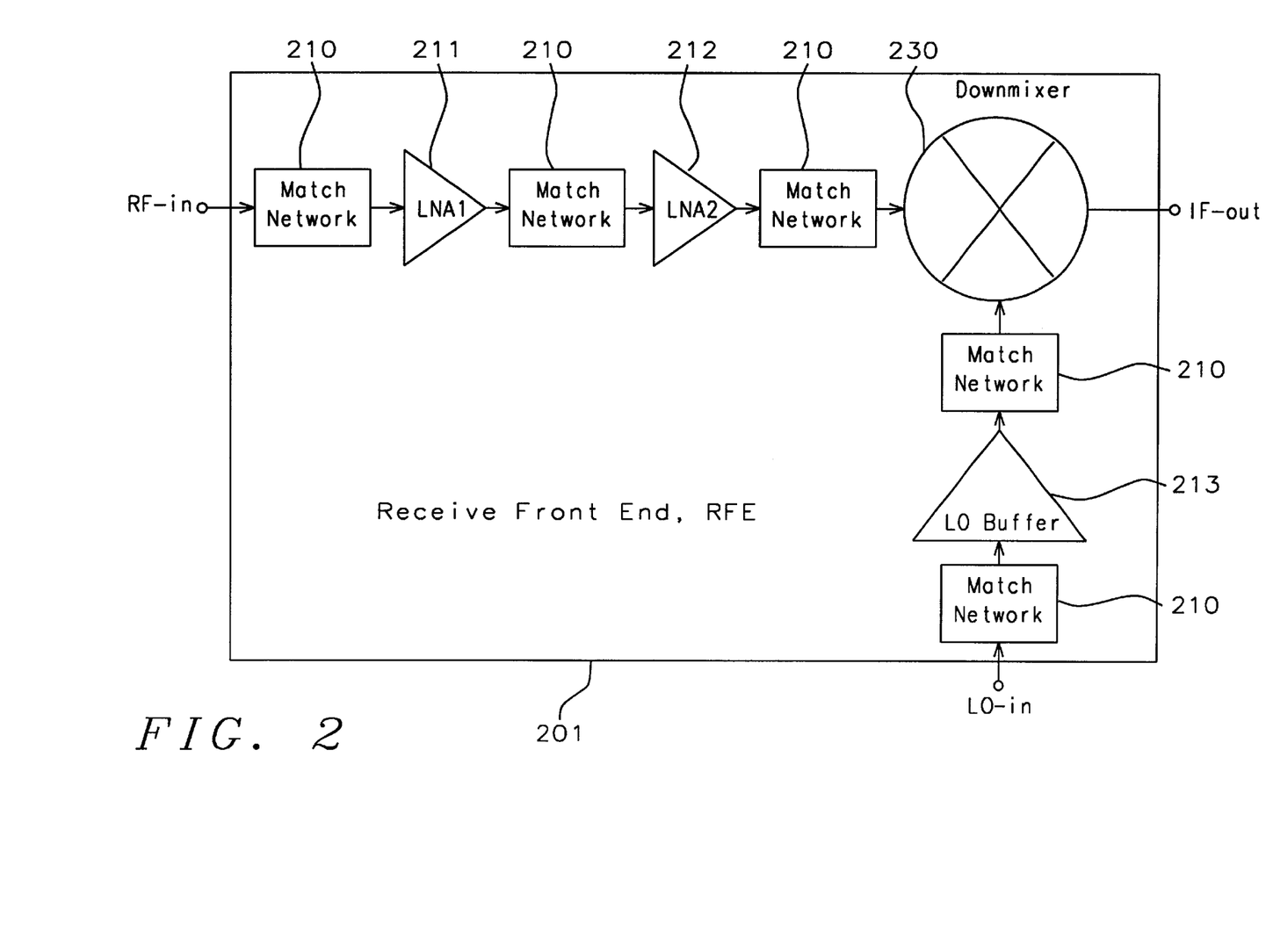
FIG. 2 is a high level block diagram of a Receive Front End for mixing two high frequency signals.

FIG. 2 depicts a Receive Front End (RFE) 201. It has inputs RF-in, LO in, and output IF-out. RF-in feeds a downmixer 230 via a series of three match networks 210, interspersed with a Low Noise Amplifier 1 (LNA1) 211, and a Low Noise Amplifier 2 (LNA2) 212. Similarly, LO-in feeds downmixer 230 via a match network 210 followed by a LO Buffer 213, followed by another match network 210.

The intermodulation product 3 or IIP3 specifications for a Personal Handy Phone or PHS system is −18 dBm. IIP3 is a figure of merit that measures how well a circuit suppresses the third order IM3 signals. It is calculated by the following formula:

$$IIP3 = Pin + \frac{Delta}{2} \qquad (1)$$

Pin is the input power and Delta is the amount of suppression IM3 is from IM1 or the power at the fundamental frequency as shown in FIG. 1.

With the newer wireless communication system which results in increasingly denser communication traffic, this IIP3 specification is becoming ever more difficult to achieve. For example the newer system like the CDMA PCS, or Code Division Multiple Access Personal Communication System, operating at 1.9 GHz have a stringent IIP3 requirement of −5 dbm.

Figure 3:
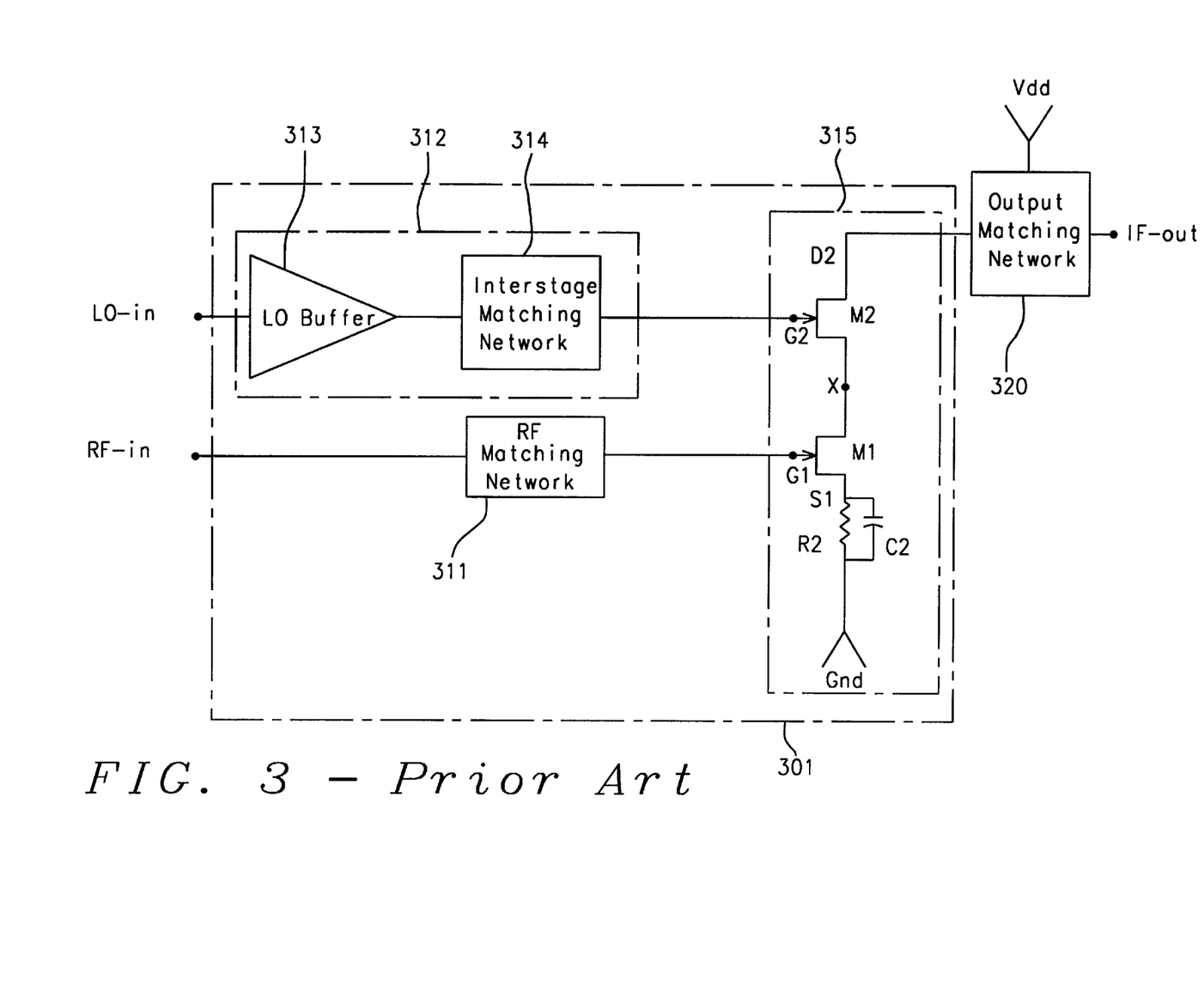
FIG. 3 is a circuit diagram of a high frequency mixer of the prior art.

In a receive front end (RFE) implementation as shown in FIG. 2, the downmixer is commonly the last block for the Microwave Monolithic Integrated Circuit (MMIC) down converter. This downmixer is commonly the implemented using the dual gate mixer topology as shown in FIG. 3. The mixer is designed as a cascode connected metal epitaxial field effect transistor (MESFET) with transistors M1 and M2 connected in series. The intermediate frequency (IF) is extracted from the drain (D2) of M2. With proper bias control at G1 and G2, a good conversion gain can be obtained. However, OIP3 of the dual gate mixer configuration is fixed even if the conversion gain of the mixer can be further increased. A new circuit topology is needed to address this bottleneck of the increase of OIP3 as is the case in the dual gate mixer. It will be difficult with the present MMIC dual gate configuration to meet the future demand in the third harmonic suppression.

We now provide a more detailed description of FIG. 3. The components of high frequency mixer circuit 301 consist of a radio frequency (RF) matching network 311, a buffer/interstage matching network 312, a dual-gate mixer, or downmixer, 315, and an output matching network 320. Network 312 is made up of a local oscillator (LO) buffer 313, followed by an Interstage matching network 314. Both network 311 and 312 are of conventional design. The RF matching network 311, with input RF-in, and the buffer/interstage matching network 312, with input LO-in, are used for suppression of even order intermodulation. The output of 311 and 312 feeds inputs G1 and G2 of dual-gate mixer 315, respectively. The dual-gate mixer frequency shifts the two input signals at G1 and G2 to an intermediate frequency (IF) signal. An output matching network 320, connected to the drain D2 of M2 and matches the impedance D2 to the impedance of output IF-out. Other inputs to the high frequency mixer circuit are a voltage supply and Ground.

Still referring to FIG. 3, the dual-gate mixer 315 consists essentially of two metal epitaxial field effect transistors (MESFET) M1 and M2 connected in a cascode manner where 311 and 314 set the DC bias for the gates of M1 and M2, respectively. Describing 315 now in greater detail, resistor R2, paralleled by capacitor C2, is connected at one end to Ground and at the other end to the source S1 of MESFET M1. The gate of M1 is connected to input G1. The drain of M1 is connected to the source of MESFET M2. The point between M1 and M2 is labeled X. The gate of M2 is connected to input G2. The drain D2 of M2 is connected to the output matching network 320.

Maas in his book (Stephen A. Maas, "Microwave Mixers", pp. 323–331, Second Edition, Artech House) provides a description of the principle behind the working of the dual gate FET as shown in FIG. 3. For optimum mixing to occur, the bottom MESFET M1 is biased near the border of the linear and saturation region for the MESFET. Therefore, as the LO signal is pumped into the gate of M2, the source follower effect allows the LO signal to affect the drain-to-source (Vds) of M1. This allows M1 to switch between the linear and saturation region and changes its transconductance and drain-to-source conductance. The resultant IF frequency is then amplified through the common gate amplifier effect of M2. With the large LO signal applied to M2, its performance is affected as a common gate amplifier for the IF signal.

U.S. Pat. No. 5,444,399 (Shiga) describes a pulse doped process MESFET which is more robust than the conventional MESFET in dealing with the problem described in the preceding paragraph. Shiga proposes a change in process such that the transconductance of the MESFET is flatter for a larger span for Vgs variation. This change implies fundamental process changes, however. U.S. Pat. No. 5,640,692 (Bothorel) discloses the addition of an attenuator before the mixer to provide a lower third order intermodulation suppression. U.S. Pat. No. 5,060,298 (Waugh et al.) provides a double balanced mixer with an active distributed balun, which results in a high third order intercept point. U.S. Pat. No. 4,949,398 (Maas) provides a GaAs MESFET mixer in which the resistive channel of the MESFET is used to approximate a time-varying liner resistor to improve intermodulation performance. U.S. Pat. No. 4,845,389 (Pyndiah, et al.) discloses a traditional dual gate mixer which adds an inductor at the junction point of the two transistors. U.S. Pat. No. 5,306,969 (Kimura) provides a dual-gate mixer in which the two FET's have different transconductances.

SUMMARY OF THE INVENTION

It is an object of the present invention to provide a mixer circuit that will have a higher third order intermodulation suppression and a more robust conversion gain.

Another object of the present invention is to provide a circuit which eliminates external components, such as inductors to act as chokes.

A further object of the present invention is to provide a circuit which can be implemented in another field effect technology such as complimentary metal oxide semiconductor (CMOS) technology.

A yet further object of the present invention is to provide a circuit which can be modified into a double balanced structure or can be used as a frequency-up converter.

These objects have been achieved by providing a new downmixer coupled where the intermediate frequency (IF) is extracted at the midpoint between two metal epitaxial field effect transistors (MESFET) of the downmixer and by adding a common source mode IF amplifier which is coupled to that midpoint.

DESCRIPTION OF THE PREFERRED EMBODIMENT

A conventional mixer, like the dual gate mixer as described in FIG. 3, where the RF and LO signals combined and the output is taken from the drain of the top MESFET M2 in the dual mixer, provide very poor third harmonic suppression. A new approach to mixing is to use cascode MESFET's with the output taken from the source of the top MESFET and the drain of the bottom MESFET M1. This is the point marked X in FIG. 3. The drain of the top MESFET is now hooked up directly to the power supply. The gate of the bottom MESFET is driven by the radio frequency (RF) input signal, while the local oscillator (LO) input signal drives the gate of the top MESFET. The output of the mixing of the RF and LO signals is available between the cascaded MESFET (point X). The output of the mixed signals, the intermediate frequency (IF) signal, is then amplified via an IF amplifier configured in a common source mode. A more reliable conversion gain results, because the IF amplification is not done through the top MESFET of the cascode network, as in the traditional dual gate mixer but through a separate common source amplifier. The dual gate mixer suffers from gain instability due to variation of the $V_{gs}$ of the top MESFET as discussed previously. In addition, the drain-to-source voltage of this common source amplifier is much better defined when compared to the drain-to-source voltage of the top MESFET of the cascode network of a dual gate configuration.

$$OIP3=IIP3+\text{Gain} \qquad (2)$$

From Eqn (2) it can be seen that if the conversion of the dual gate is increased with no corresponding increase in OIP3 will be increasingly difficult to meet the IIP3 specification. Eqn (3) gives the formula for the computation of overall $OIP3_{Total}$ of any system, provided that each of the n stages has the port end 50 ohm matched.

$$\frac{1}{OIP3_{Total}} = \left[\left(\frac{1}{OIP3_n}\right)+\left(\frac{1}{OIP3_{n-1}*G_n}\right)+\ldots+\left(\frac{1}{OIP3_1*G_2\ldots*G_n}\right)\right] \qquad (3)$$

where OIP3, G are in power units, $$G=\log^{-1}\left\{\frac{G(\text{dB})}{10}\right\} \quad \text{(for conversion to power units)} \qquad (4)$$

Eqn (3) is reduced to Eqn (5) for a receive front end (RFE) system as represented in FIG. 2.

$$\frac{1}{OIP3_{RFE}} = \left[\left(\frac{1}{OIP3_{Mixer}}\right)+\left(\frac{1}{OIP3_{LNA}*G_{Mixer}}\right)\right] \qquad (5)$$

Eqn (5) is an approximation when dealing with an MMIC RFE in which the inter-stage matching is not 50 ohm.

From Eqn (5) we can see it is crucial to improve the $OIP3_{Mixer}$ of the dual gate mixer as this will have a direct impact on the overall $OIP3_{RFE}$ of the RFE. In most situations the $OIP3_{LNA}$ is reasonable, such that the second term of Eqn (5) is insignificant compared to the first term. This only is true if the mixer gain $G_{Mixer}$ is maintained at some reasonable level. If $OIP3_{Mixer}$ can be improved it will mean that we can afford to have more overall gain margin, while maintaining the $IIP3_{RFE}$.

The circuit of the present invention is designed to have a high OIP3. Very often the constraints to overall OIP3 are caused by the conventional mixer having good conversion gain but low OIP3. Conventional MMIC dual gate mixers usually suffer from low OIP3 when compared to their Low Noise Amplifier (LNA) counterparts. A higher conversion gain is not always good because it makes the IIP3 more difficult to achieve. The present invention achieves good OIP3 with reasonable conversion gain which is ideal for usage with a two stage LNA design as shown in FIG. 2. Therefore, this design will provide more of a design margin for the overall conversion gain. Very often the conversion gain in the RFE is suppressed in order to meet the input IP3 specification. Therefore, for this present invention there is no need for attenuation of gain as the output of IP3 of the mixer is better than the conventional dual gate configuration.

Figure 4:
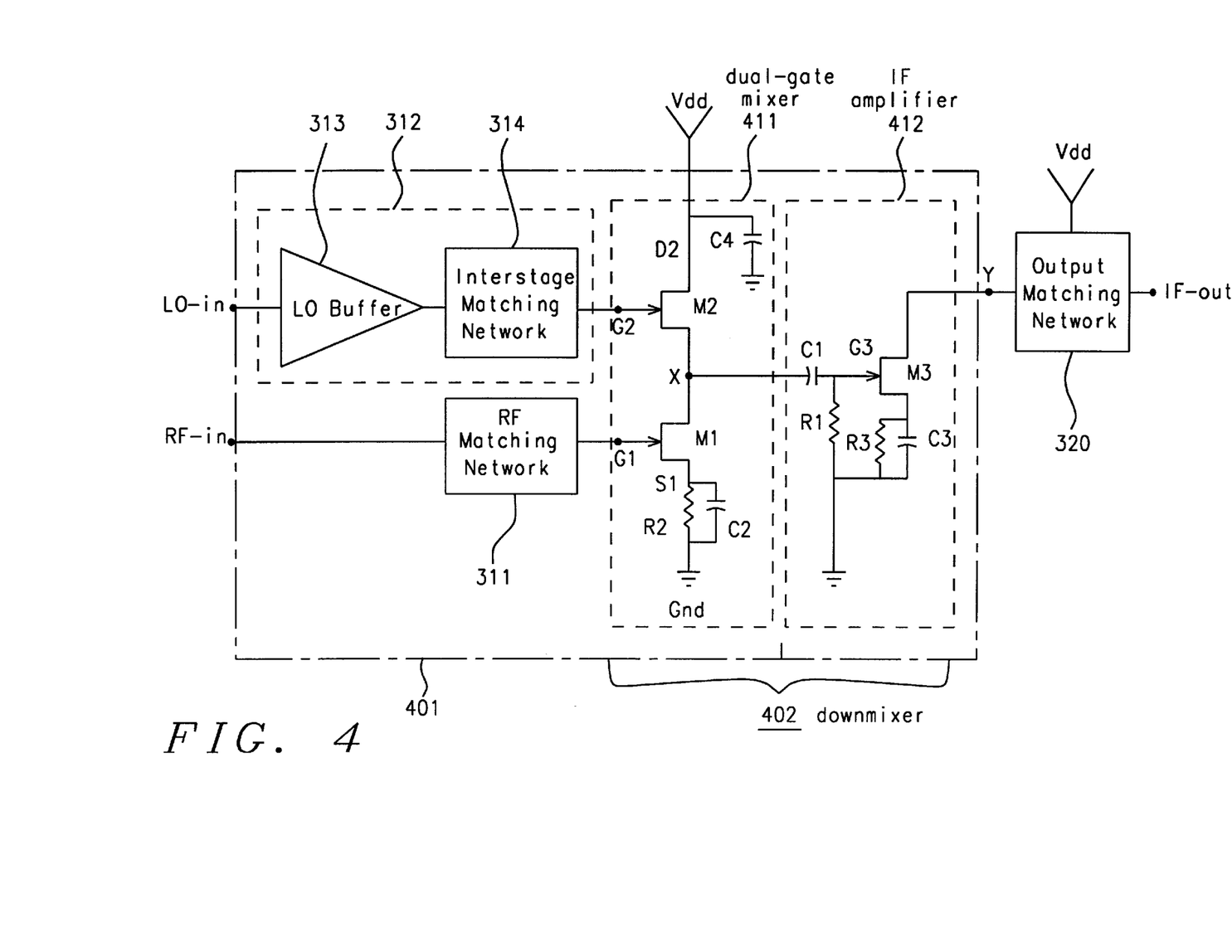
FIG. 4 is a circuit diagram of a high frequency mixer of the preferred embodiment of the present invention.

Referring now to FIG. 4, we describe the preferred embodiment of the invention. The components of a high frequency mixer circuit 401 consist of a radio frequency (RF) matching network 311, a buffer/interstage matching network 312, a dual-gate mixer 411, an intermediate frequency (IF) amplifier 412, and an output matching network 320. The dual-gate mixer 411 and IF amplifier 412 together comprise the downmixer 402. Network 312 is made up of a local oscillator (LO) buffer 313 followed by an Interstage matching network 314. Both network 311 and 312 are of conventional design. The RF matching network 311, with input RF-in, and the buffer/interstage matching network 312, with input LO-in, are used for suppression of even order intermodulation. The output of 311 and 312 feeds inputs G1 and G2 of dual-gate mixer 411, respectively. The dual-gate mixer frequency shifts the two input signals at G1 and G2 to an intermediate frequency (IF) signal and provides an input for the IF amplifier 412. The IF amplifier produces an amplified output of that IF signal at output Y. An output matching network 320, connected to output Y matches the impedance of output Y to the impedance of output IF-out. Other inputs to the high frequency mixer circuit are a voltage supply and a reference potential (Ground in the preferred embodiment).

Still referring to FIG. 4, the dual-gate mixer 411 consists essentially of two metal epitaxial field effect transistors (MESFET) M1 and M2 connected in a cascade manner where 311 and 314 set the DC bias for the gates of M1 and M2, respectively. Describing 411 now in greater detail, resistor R2, paralleled by capacitor C2, is connected at one end to the reference potential (Ground) and at the other end to the source S1 of MESFET M1. The gate of M1 is connected to input G1. The drain of M1 is connected to the source of MESFET M2. The point between M1 and M2 is labeled X and is the output of the dual-gate mixer 411. The gate of M2 is connected to input G2. The drain D2 of M2 is connected to the power supply Vdd and to capacitor C4, which in turn is connected to the reference potential Gnd.

The IF amplifier 412 is made up of the following components. Capacitor C1, acting as a direct current (DC) block, connects to output X and in turn connects to resistor R1 and the gate G3 of MESFET M3. Resistor R1, which typically ranges from 5 Kohm to 10 Kohm, provides the DC bias for the gate of M3. The other end of resistor R1 connects to the reference potential. Resistor R3, in parallel with capacitor C3, connects between the reference potential and the source of MESFET M3. The drain of M3 connects to output Y of the IF amplifier, output Y is also the output of high frequency mixer 401. IF amplifier 412 produces, from the IF signal at output X, an amplified signal at output Y. Capacitor C1 in addition to acting as a DC block also functions to alternate current (AC) couple the IF signal of output X to the gate of the MESFET of IF amplifier 412. IF amplifier 412 is configured as a common source amplifier and provides a more reliable gain from MESFET M3 because it operates in the saturation region.

When a signal, of frequency F1, is applied to input RF-in and a signal, of frequency F2, is applied to input LO-in, the signal at output X of the dual-gate mixer is an IF signal with a frequency equal to the difference between the frequencies of the LO-in input and the RF-in input.

Output matching network 320 connects to output Y and provides impedance matching between output Y and output IF-out. Output matching network 320 is of traditional design and well understood by those skilled in the art and is, therefore, not described further.

To highlight the usefulness of the preferred embodiment of the present invention, simulation results are tabulated in TABLE 1.

TABLE 1 comparison of simulation results between new and traditional downmixer.

Figure 5:
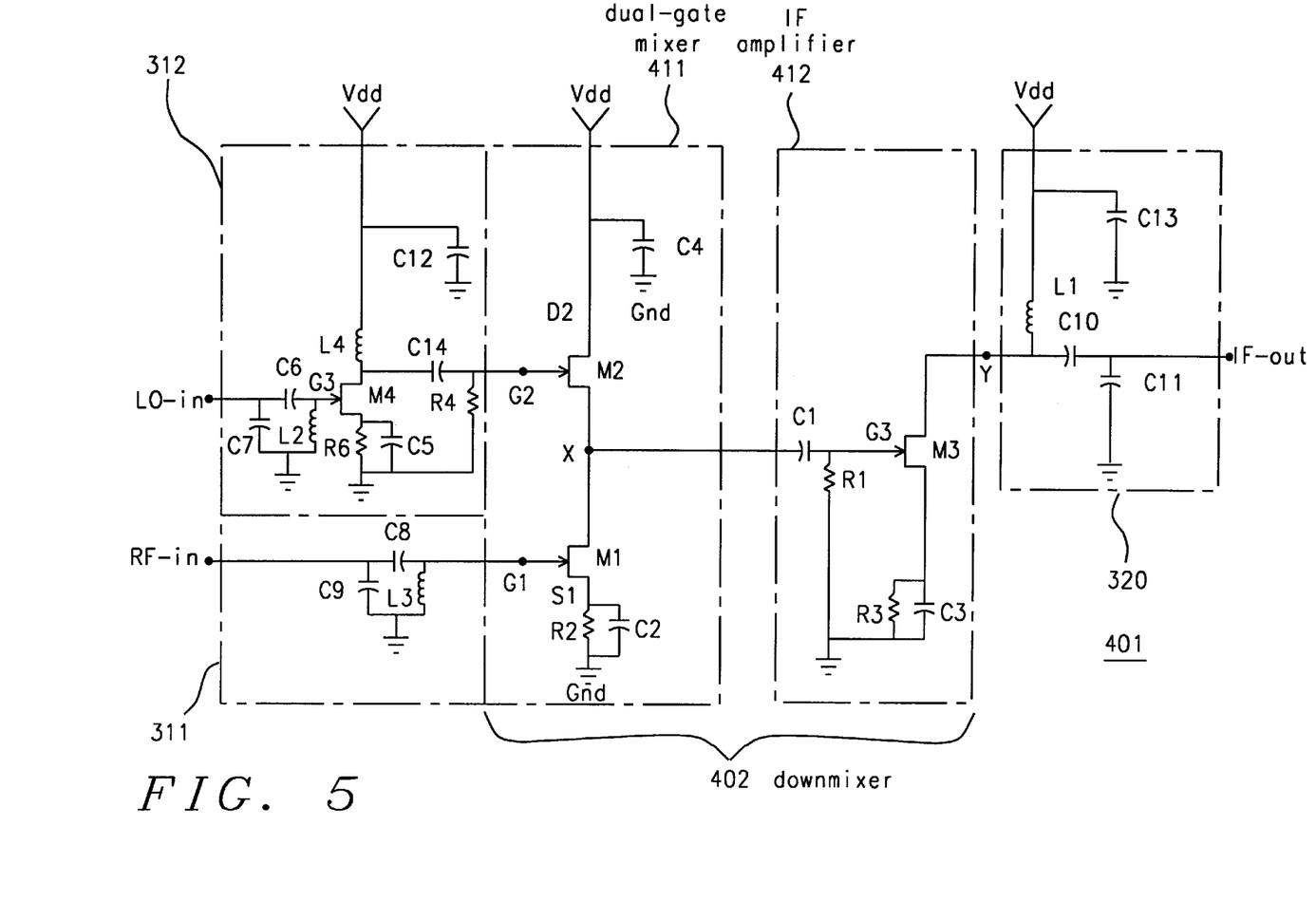
FIG. 5 is a detailed circuit diagram of a high frequency mixer of the preferred embodiment of the present invention.
Figure 6:
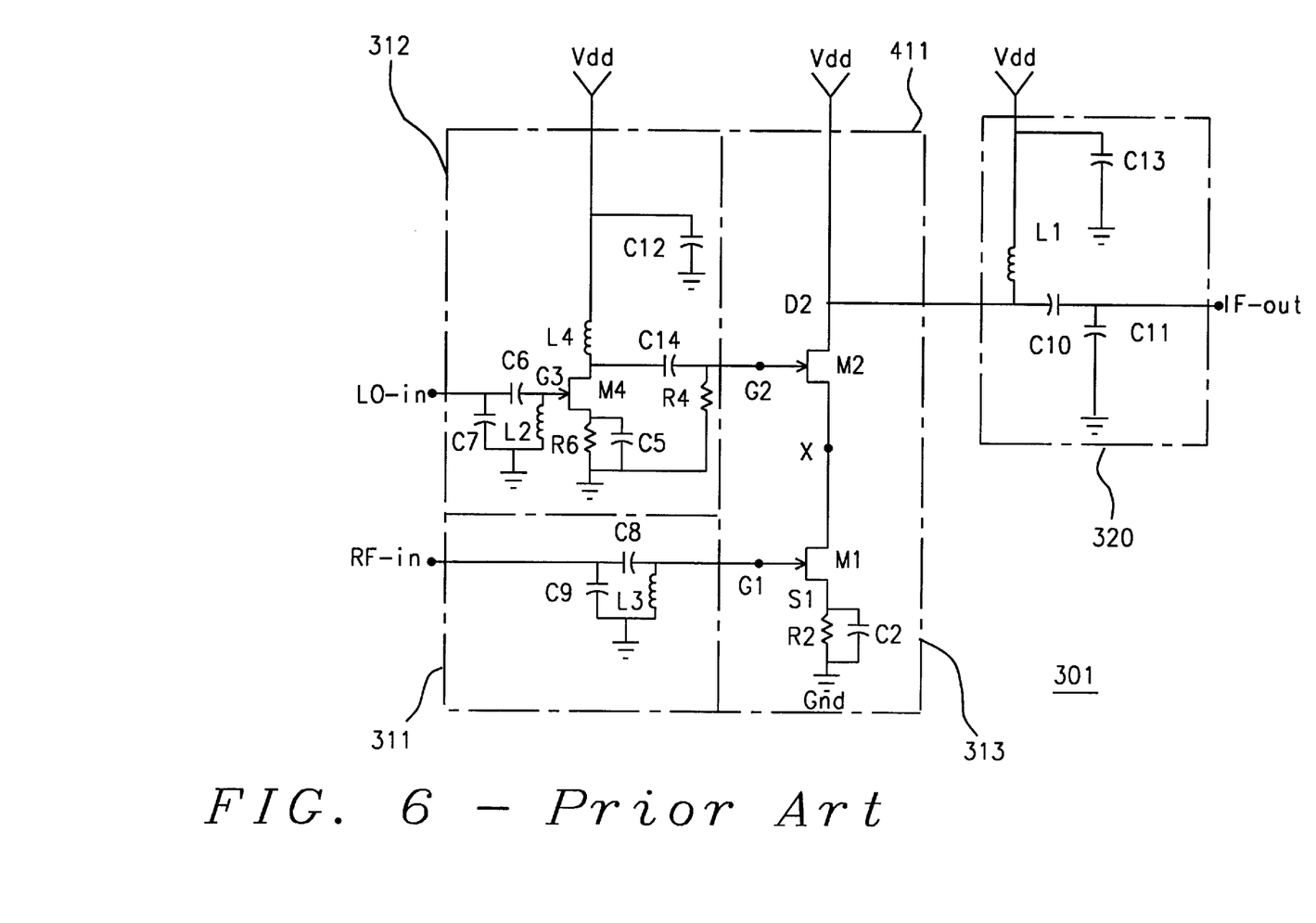
FIG. 6 is a detailed circuit diagram of a high frequency mixer of the prior art.

| Description | New Downmixer as in FIG. 5 | | | Traditional Downmixer as in FIG. 6 |
| --- | --- | --- | --- | --- |
| | typical | from | to | |
| Conversion Gain (dB) | 10 | 9 | 11 | 7.5 |
| Image-Band Att. (dB) | 8.3 | 8 | 9 | 7.8 |
| Drain Current (mA) | 11.8 | 11 | 13 | 11.5 |
| OIP3, output IP3 Pin = −40 dBm (dBm) | 21.7 | 19 | 23 | 8.6 |
| IIP3, input IP3 Pin = −40 dBm (dBm) | 11.7 | 10 | 12 | 1.1 |
| Local Leak Level at RF-in port (dBm) | −21 | −23 | −19 | −17.9 |
| Noise Figure (dB) | 12.3 | 11 | 13 | 11.8 |
| RF-in return loss (dB) | 25.4 | 20 | 30 | 37.8 |
| LO-in return loss (dB) | 24.7 | 20 | 30 | 40 |
| IF-out return loss (dB) | 29.8 | 25 | 40 | 34.7 |

FIG. 5 shows the detailed circuit diagram of the simulated new downmixer. The circuit of FIG. 5 is the same as that of FIG. 4, the only difference is that RF matching network 311 and buffer/interstage matching network 312 are shown in detail. These matching networks are of traditional design and well understood by those skilled in the art and are, therefore, not described further.

FIG. 6 shows the detailed circuit diagram of the traditional downmixer. The circuit of FIG. 6 is the same as that of FIG. 3, the only difference is that RF matching network 311 and buffer/interstage matching network 312 are shown in detail. These matching networks are identical to those of FIG. 5.

For those skilled in the art the downmixer can also be implemented in another field effect technology such as complimentary metal oxide semiconductor (CMOS) technology. The downmixer 402 comprised of dual-gate mixer 411 and IF amplifier 412 described heretofore can also be implemented in a double balanced structure or can equally well be used for frequency-up conversion.

The key advantage of this present invention is that it provides a good OIP3 at a reasonable gain. Although this high gain mixer is designed and optimized for the Japanese 1.9 GHz frequency, it can be easily tuned to function at other wireless phone applications of frequencies from 800 MHz to 5.8 GHz. The chip is designed to be fitted into a cheap plastic package for low cost manufacturing. This invention also provide a mixer circuit that will have a higher third order intermodulation suppression and a more robust conversion gain. In addition, it eliminates the need for external components, such as inductors to act as chokes.

Furthermore the present invention can be implemented in another field effect technology, such as the complimentary metal oxide semiconductor (CMOS) technology or it can be modified into a double balanced structure or can be used as a frequency-up converter.

While the invention has been particularly shown and described with reference to the preferred embodiments thereof, it will be understood by those skilled in the art that various changes in form and details may be made without departing from the spirit and scope of the invention.

What is claimed is:

1. A high frequency mixer circuit, comprising:
   a radio frequency (RF) matching network, for suppression of even order intermodulation, with an input RF-in and an output;
   a buffer/interstage matching network, for suppression of even order intermodulation, with an input LO-in and an output;

a downmixer, for frequency shifting to an intermediate frequency (IF) signal and amplifying said IF signal, with an input G1, an input G2, and an output Y, said downmixer further comprising a dual-gate mixer, for frequency shifting to said IF signal, said dual-gate mixer having said input G1, said input G2, and an output X, said dual-gate mixer further comprising a first and a second metal epitaxial field effect transistor (MESFET), where the drain of said first MESFET and the source of said second MESFET are connected to said output X, and an IF amplifier, to amplify said IF signal, said IF amplifier having an input and said output Y, said input of said IF amplifier connected to said output X;

an output matching network with an input connected to said output Y, and an output IF-out, said output matching network for matching the impedance of said output Y of said downmixer to the impedance of said output IF-out;

a power supply; and a reference potential.

2. The circuit of claim 1, wherein said output of said RF matching network is connected to said input G1.

3. The circuit of claim 1, wherein said output of said buffer/interstage matching network is connected to said input G2.

4. The circuit of claim 1, wherein said dual-gate mixer further comprises:

a first resistor with one end connected to said reference potential;

a first capacitor with one end connected to said reference potential and the other end connected to the other end of said first resistor;

said first metal epitaxial field effect transistor (MESFET) having a source-drain path and a gate, said source of said first MESFET connected to the other end of said first resistor, and said gate of said first MESFET connected to said input G1;

said second MESFET having a source-drain path and a gate, said drain of said second MESFET connected to said power supply, and said gate of said second MESFET connected to said input G2; and a second capacitor connected between said drain of said second MESFET and said reference potential.

5. The circuit of claim 1, wherein said IF amplifier comprises:

a first capacitor with one end connected to said output X;

a first resistor with one end connected to said reference potential and the other end connected to the other end of said first capacitor of said IF amplifier;

a second resistor with one end connected to said reference potential;

a second capacitor with one end connected to said reference potential and the other end connected to the other end of said second resistor of said IF amplifier; and a MESFET having a source-drain path and a gate, said source-drain of said MESFET connected between the other end of said second resistor of said IF amplifier and said output Y of said downmixer, said gate of said MESFET connected to the other end of said first capacitor of said IF amplifier.

6. The circuit of claim 1, wherein said first capacitor of said IF amplifier is a direct current (DC) blocking capacitor.

7. The circuit of claim 1, wherein said first capacitor of said IF amplifier is used to alternate current (AC) couple said IF signal to said gate of said MESFET of said IF amplifier.

8. The circuit of claim 1, wherein said IF amplifier is configured as a common source amplifier.

9. The circuit of claim 1, wherein said first resistor of said IF amplifier produces a bias voltage for said gate of said MESFET of said IF amplifier.

10. The circuit of claim 1, wherein said first resistor of said IF amplifier is in the range of 5 Kohm to 10 Kohm.

11. The circuit of claim 1, wherein said downmixer has a conversion gain in the range of 9 dBm to 11 dBm.

12. The circuit of claim 1, wherein said downmixer has an output intermodulation product (OIP3) in the range of 19 dBm to 23 dBm.

13. The circuit of claim 1, wherein said downmixer has a input intermodulation product (IIP3) in the range of 10 dBm to 12 dBm.

14. The circuit of claim 1, wherein said downmixer has a Local Leak Level at said input RF-in in the range of −23 dBm to −19 dBm.

15. The circuit of claim 1, wherein said downmixer has a noise figure in the range of 11 dB to 13 dB.

16. The circuit of claim 1, wherein said downmixer has an RF-in return loss in the range of 20 dB to 30 dB.

17. The circuit of claim 1, wherein said downmixer has an LO-in return loss in the range of 20 dB to 30 dB.

18. The circuit of claim 1, wherein said downmixer has an IF-out return loss in the range of 25 dB to 40 dB.

* * * * *